(12) United States Patent  
Chow et al.

(10) Patent No.: US 8,917,571 B2
(45) Date of Patent: Dec. 23, 2014

(54) CONFIGURABLE-WIDTH MEMORY CHANNELS FOR STACKED MEMORY STRUCTURES

(71) Applicant: Oracle International Corporation, Redwood City, CA (US)

(72) Inventors: Alex Chow, Palo Alto, CA (US); Philip Amberg, San Jose, CA (US); Robert David Hopkins, II, Foster City, CA (US)

(73) Assignee: Oracle International Corporation, Redwood Shores, CA (US)

( * ) Notice: Subject to any disclaimer, the term of this patent is extended or adjusted under 35 U.S.C. 154(b) by 78 days.

(21) Appl. No.: 13/732,972

(22) Filed: Jan. 2, 2013

(65) Prior Publication Data

US 2014/0185352 A1    Jul. 3, 2014

(51) Int. Cl.
  *G11C 8/12* (2006.01)
  *G11C 5/06* (2006.01)
  *G11C 7/18* (2006.01)
  *G11C 7/10* (2006.01)
  *G11C 5/02* (2006.01)

(52) U.S. Cl.
  CPC .. *G11C 5/06* (2013.01); *G11C 7/18* (2013.01); *G11C 7/10* (2013.01); *G11C 5/025* (2013.01); *G11C 8/12* (2013.01)

USPC ............ 365/230.03; 365/189.02; 365/185.25; 365/222

(58) Field of Classification Search
  CPC .......... G11C 8/12; G11C 7/18; G11C 7/1006; G11C 5/025; G11C 7/10
  USPC .................... 365/189.02, 230.03, 185.25, 222
  See application file for complete search history.

(56) References Cited

U.S. PATENT DOCUMENTS 7,499,340 B2 *   3/2009   Kajigaya et al. .......... 365/189.02

* cited by examiner

*Primary Examiner* — Jason Lappas
(74) *Attorney, Agent, or Firm* — Park, Vaughan, Fleming & Dowler LLP; Mark Spiller (57) ABSTRACT

The disclosed embodiments provide a chip package that facilitates configurable-width memory channels. In this chip package, a semiconductor die is electrically connected to two or more memory chips. More specifically, contacts on each individual memory chip are each directly connected to a distinct set of contacts on the semiconductor die such that the semiconductor die has separate, unique command and address buses to individually address and communicate with each individual memory chip. Individually addressable memory chips that are each accessed via separate command and address buses facilitate a configurable-width memory channel that efficiently supports different data-access granularities.

20 Claims, 8 Drawing Sheets

CONFIGURABLE-WIDTH MEMORY CHANNELS FOR STACKED MEMORY STRUCTURES

BACKGROUND

1. Field of the Invention

This disclosure generally relates to the design of a semiconductor chip package. More specifically, this disclosure relates to a chip package in which a set of memory structures that are stacked upon a host structure in the chip package provide a configurable-width memory channel.

2. Related Art

In many conventional computer systems, multiple DRAM devices are arranged in parallel to provide a fixed-width data interface with a memory controller. Because limited pin and routing resources in a memory module prevent individual addressing of each memory chip, memory devices within a given rank are typically accessed in lockstep using an address provided on a shared bus. In such designs, the memory controller reads and writes data in blocks of a prescribed data word, regardless of the actual number of bytes requested by the processor.

Unfortunately, such designs can lead to inefficient memory accesses. For example, consider an access for a commodity DRAM module that supports a 64-bit wide data bus. If a processor requests and uses only a single byte (e.g., eight bits) of data at random, the memory access is inefficient, because only one out of every eight bytes of data transferred is useful.

Hence, what is needed are structures and techniques for accessing memory systems without the above-described problems of existing techniques.

SUMMARY

The disclosed embodiments provide a chip package that facilitates configurable-width memory channels. In this chip package, a semiconductor die is electrically connected to two or more memory chips. More specifically, contacts on each individual memory chip are each directly connected to a distinct set of contacts on the semiconductor die such that the semiconductor die has separate, unique command and address buses to individually address and communicate with each individual memory chip. Individually addressable memory chips that are each accessed via separate command and address buses facilitate a configurable-width memory channel that efficiently supports different data-access granularities.

In some embodiments, the chip package also comprises an interposer located between the semiconductor die and the memory chips. In these embodiments, contacts on the interposer are directly connected to contacts on the semiconductor die, and contacts on each individual memory chip are each directly connected to a distinct set of contacts on the interposer such that the semiconductor die has separate, unique command and address buses to individually address and communicate with each individual memory chip via the interposer. Note that the interposer may be larger than the semiconductor die, and may provide power to the memory chips.

In some embodiments, the semiconductor die sends a memory request to a subset of the memory chips. These memory chips perform (in parallel) a memory operation in response to this memory request. During this operation, a second subset of the two or more memory chips that do not store data requested by the memory request do not receive the memory request, and remain in a standby state. Performing the memory operation in only the first subset of memory chips reduces the power used by the chip package for memory requests with a data-access granularity that is smaller than the full memory width supported by the full set of memory chips.

In some embodiments, the semiconductor die sends a memory request to all of the memory chips. In these embodiments, all of the memory chips perform a memory operation in parallel in response to the second memory request, thereby using the full memory width supported by the full set of memory chips.

In some embodiments, the semiconductor die simultaneously sends two distinct memory requests to different subsets of the memory chips. The first memory request is sent to a first subset of the memory chips, while the second request is sent to a second, distinct subset of the memory chips. Both subsets of memory chips simultaneously perform separate memory operations in response to the memory requests.

In some embodiments, the memory chips are stacked upon the semiconductor die at an offset such that the pins of each memory chip are directly connected to contacts on the semiconductor die. Stacking the two or more memory chips upon the semiconductor die increases memory chip density and shortens I/O trace lengths, thereby facilitating individually addressing each of the memory chips.

In some embodiments, the memory chips are stacked vertically on top of the semiconductor die and are connected to the semiconductor die using through-silicon vias.

In some embodiments, the chip package includes a customized memory controller that facilitates accessing data with variable granularities from the memory chips. This customized memory controller can determine when only a subset of the memory chips are needed for a given memory access and, if so, issue requests to only that subset of the memory chips. Furthermore, the customized memory controller can also determine when multiple memory requests access different subsets of the memory chips and, if so, issue parallel requests to those different subsets.

In some embodiments, a compiler is configured to generate memory instructions that store data into the memory chips in a layout that takes advantage of the configurable-width memory channel to reduce the power usage of the chip package during operation.

In some embodiments, an application is configured to perform memory operations that store data into the memory chips in a layout that takes advantage of the configurable-width memory channel to reduce the power usage of the chip package during operation.

BRIEF DESCRIPTION OF THE FIGURES

Table 1 illustrates the pin-out of an unbuffered DIMM in accordance with an embodiment.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a non-transitory computer-readable storage medium, which may be any device or non-transitory medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium.

Furthermore, the methods and processes described below can be included in hardware modules. For example, the hardware modules can include, but are not limited to, application-specific integrated circuit (ASIC) chips, a full-custom implementation as part of an integrated circuit (or another type of hardware implementation on an integrated circuit), field-programmable gate arrays (FPGAs), a dedicated or shared processor that executes a particular software module or a piece of code at a particular time, and/or other programmable-logic devices now known or later developed. When the hardware modules are activated, the hardware modules perform the methods and processes included within the hardware modules.

Organization and Operation of DRAM Chips

Some embodiments of the present invention relate to a chip package in which a set of memory structures that are stacked upon a host chip are accessed using configurable-width memory channels. The following sections describe the organization and operation of DRAM (dynamic random-access memory) chips, the limitations involved with accessing multiple DRAM devices in conventional memory systems, and architectures in which memory structures that are stacked upon a host chip can be efficiently accessed using configurable-width memory channels.

In a typical memory system, multiple DRAM devices (e.g., multiple individual DRAM chips) are arranged in parallel to provide a fixed-width data interface to a memory controller. Devices within a "rank" (e.g., a given group that are accessed together, described in more detail below) access in lockstep a single memory address that is provided on a shared bus; this shared-bus organization is necessary because limited pin and routing resources in a memory module prevent individual addressing of each memory chip. As a result, the memory controller must always read and write data in blocks of a prescribed data word, regardless of the actual number of bytes requested by the processor.

Commercial DRAM chips typically have standard channel widths (e.g., 4, 8, 16, or 32 bits, with the respective components being referred to as ×4, ×8, ×16, and ×32 parts). Each chip maintains a table of memory cells which are accessed by row and column, with each (row, column) address providing access to a data word of the chip's specified channel width. Arrays of memory cells are often organized in banks (e.g., a given DRAM chip might include four or eight banks per chip).

Figure 1:
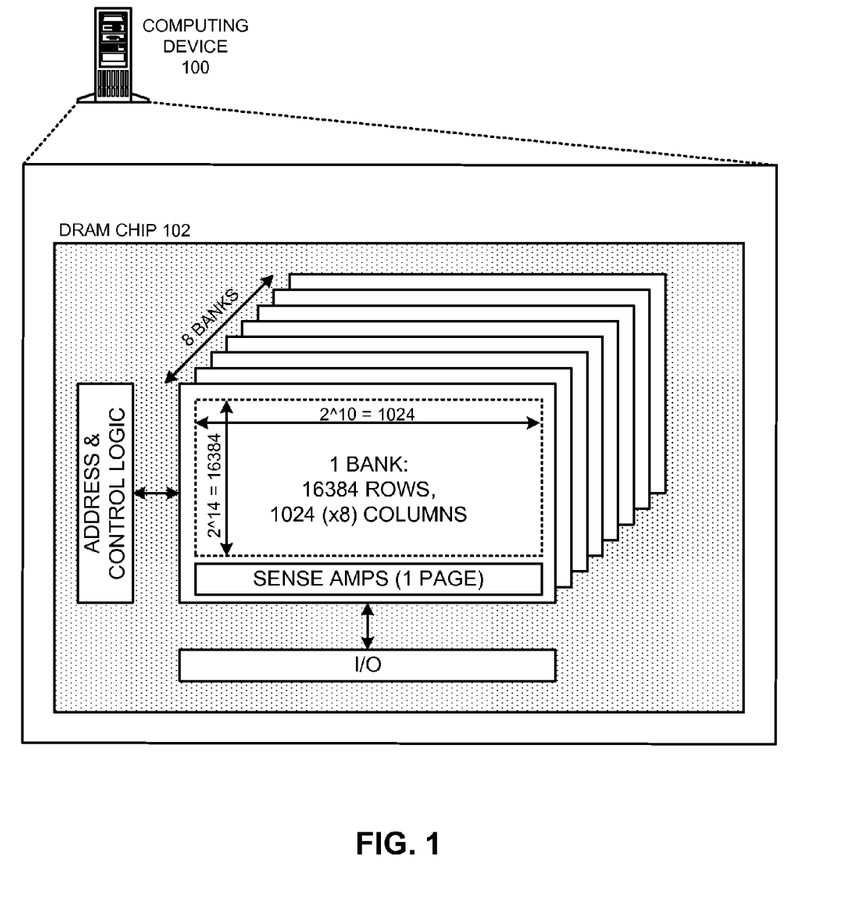
FIG. 1 illustrates the organization of a DRAM memory chip in accordance with an embodiment.

FIG. 1 illustrates the organization of an exemplary 1 Gigabit ×8 DDRx DRAM chip 102 that is included in an exemplary computing device 100 (where the 'x' in DDRx represents the generation of DDR (double data rate) memory technology being used). DRAM chip 102 includes eight banks, each of which consists of 16384 rows and 1024 columns of memory cells. Each of these memory cells stores an eight-bit value. The eight banks of DRAM chip 102 collectively return one eight-bit-wide value during a memory access; for example, a memory read request includes an address that is used to determine one bank among the eight banks that will look up and return a value stored in one eight-bit cell. Each row within a bank is also referred to as a page; thus, the page size of this device is:

1024 bits(×8 bits/cell)=1024 bytes.

The total capacity of DRAM chip 102 is:

16384 rows×1024 columns×8 bits/cell×8 banks=$1024^3$ bits=1 Gigabit. Addressing a memory address in DRAM chip 102 involves using three bits to specify a bank address, using 14 bits to specify a row address, and using ten bits to specify a column address. Eight such chips can be accessed in parallel during a memory access to return a 64-bit value.

In some implementations, to reduce the number of pins needed for a DRAM chip, one shared bus is used to specify both row and column addresses, with two separate signals (the Row Address Strobe (RAS) and Column Address Strobe (CAS)) indicating the type of address being presented on the bus. In such implementations, reading memory involves: 1) decoding a row address; 2) issuing an activate command to amplify and capture data in the selected row of cells (within the selected bank); 3) decoding a column address; and then 4) sending one window (e.g., eight bits in the case of a ×8 DRAM chip) to an output buffer. Note that an entire page (row) of cells is accessed upon every activation. If a different row is accessed after the first request, a pre-charge command is issued to reset all the bit lines in preparation for activation of the next page.

Activation and pre-charge operations are costly in terms of latency and energy, because they operate on entire pages of cells. However, each bank may be activated and pre-charged independently, so it is possible to overlap activate and pre-charge commands to different banks in order to hide some latency.

To reduce overhead for accessing large blocks of data, many memory devices may be operated in burst mode, where a number (often referred to as the burst length, BL) of memory words are returned for each address strobe. For example, eight bytes of data are returned per column strobe by a ×8 memory device part configured for BL=8 accesses.

Note that the access and control functionality of memory parts typically need to conform to a set of specified electrical and timing constraints. For instance, some standardized timing parameters may include:

TRC, the row cycle time—the minimum time between activate commands to the same bank;

TRAS, the row open time—the minimum time between activate and pre-charge commands to the same bank;

TRTP, the read-to-pre-charge time—the minimum time between read and pre-charge commands;

TRP, the pre-charge time—the minimum time between pre-charge and activate commands; and TRCD, the row access time—the time between activate and read or write commands.

Conventional Memory Systems

Unfortunately, memory packaging technologies sometimes can lead to inefficiency and performance limitations in conventional memory systems. This section describes some of these issues.

DRAM chips typically have a fairly narrow data interface. For instance, DDR3 memory devices are typically offered in widths of 4, 8, or 16 bits (e.g., ×4, ×8, and ×16 parts, as described above). To provide higher memory bandwidth, a conventional memory module uses multiple DRAM chips in parallel to provide a wider data bus. For example, the bus width of DDR, DDR2, and DDR3 DRAM is 64 bits per channel. Such a 64-bit channel might comprise eight ×8 parts or four ×16 parts that are used in parallel to form the one channel.

Figure 2A:
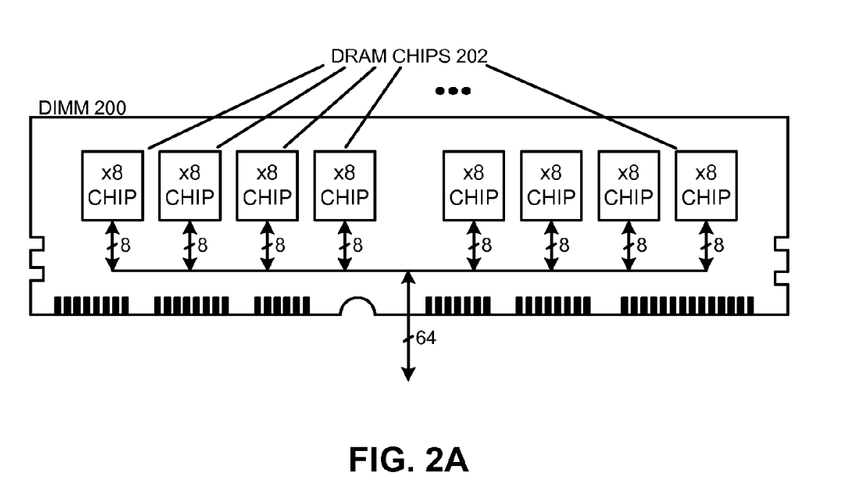
FIG. 2A illustrates a non-error-correcting code dual in-line memory module (DIMM) in accordance with an embodiment.

FIG. 2A illustrates a non-error-correcting code (non-ECC) dual in-line memory module (DIMM) 200 that uses eight ×8 parts to provide a 64-bit data bus. To provide sufficient bandwidth, data links between the memory controller (not shown) and DIMM 200 are point-to-point; each DRAM chip 202 has a separate data bus. However, due to the limited number of pins and routing tracks on a DIMM and the difficulty of matching a large number of traces to minimize timing skew, the command and address lines must be shared among all of the DRAM chips 202. Note that some error-correcting code (ECC) memories use a 72-bit wide bus, but only use 64 bits of that bus for data.

A group of chips that provide a standard data word (e.g., a 64-bit data word) is called a rank. A DIMM may carry multiple ranks (e.g., one on each side of the module's board) to increase storage capacity. Ranks are typically accessed separately, one at a time. Some signals (e.g., address and command signals) may be shared between ranks, while other signals that toggle at full clock frequency (e.g., CK[P,N] and ODT, which are listed in Table 1 below) may include dedicated lanes for each rank.

TABLE 1

| Signal | Function | Routing | Type | Pin Count |
|---|---|---|---|---|
| A[14:0] | Row and column address | Shared bus | Address/Command | 15 |

TABLE 1-continued

| Signal | Function | Routing | Type | Pin Count |
|---|---|---|---|---|
| BA[2:0] | Bank address | | | 3 |
| CKE0 | Clock enable | | | 1 |
| ODT[1:0] | Termination control | | | 2 |
| RAS# | Row address strobe | | | 1 |
| CAS# | Column address strobe | | | 1 |
| WE# | Write enable | | | 1 |
| S0# | Chip select | | | 1 |
| RESET# | Reset | | | 1 |
| CK[P,N][1:0] | Clock | Shared bus | Clock | 4 |
| DM[7:0] | Data mask | Point-to-point | Data | 8 |
| DQ[63:0] | Data | | | 64 |
| DQS[P,N][7:0] | Data strobe | | | 16 |
| SA[2:0], SCL, VDDSPD | SPD EEPROM | | | 5 |
| VREFDQ, VREFCA | Reference voltages | | | 2 |
| VDD | Power | | Supplies | 22 |
| VSS | Ground | | | 59 |
| VTT | Termination | | | 2 |
| NC | No connection | | | 32 |

Table 1 illustrates the pin-out of a standard 240-pin unbuffered DIMM. On each module, 88 lanes are used to carry data, data strobe, and data mask signals, and 27 lanes (on a single-rank DIMM) are used for address, command, and clocking signals.

Figure 2B:
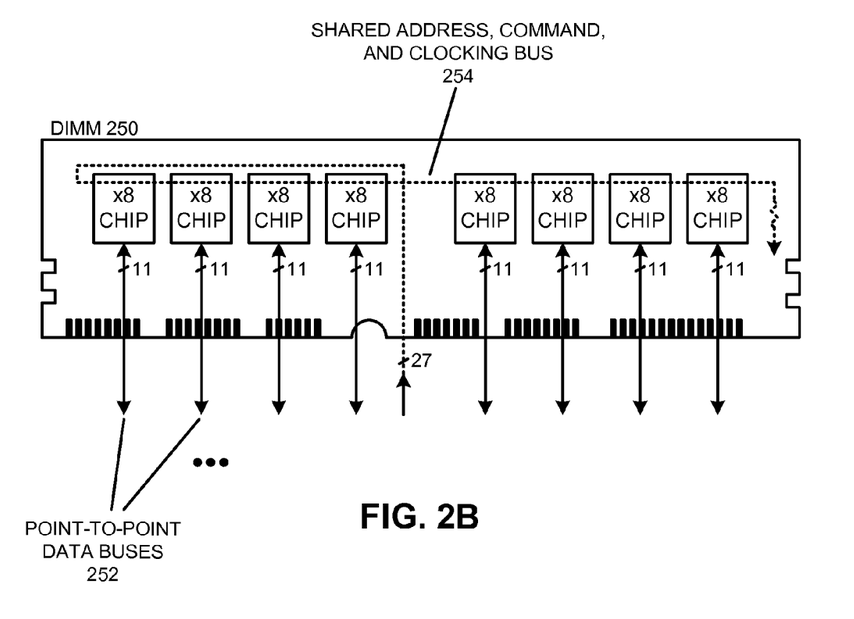
FIG. 2B illustrates bus routings for an exemplary non-error-correcting code DIMM in accordance with an embodiment.

FIG. 2B illustrates the routing of point-to-point data buses 252 and a shared address, command, and clocking bus 254 on a non-ECC DIMM 250. The DDR3 memory organization introduces a fly-by architecture for the address, command, and clock signals, which are connected in series to each DRAM chip on DIMM 250. Compared to a T-branch topology used in some DIMMs, this fly-by architecture reduces stub lengths and simplifies board design. However, this architecture also introduces systematic skew between clock and data, with the amount of skew differing for each chip. As a result, DDR3 DRAM devices need to support write and read leveling features that train the controller to compensate for such skews.

Note that sharing an address and command bus across all of the DRAM chips on a DIMM fixes the granularity of data access for the DIMM, thereby imposing a fundamental conflict between data bandwidth and access granularity. More specifically, a need for high bandwidth suggests using a wide data interface (e.g., using many DRAM chips in parallel), while the desire for fine-grain access advocates using a narrow data interface. DDRx memory modules typically have a fixed 64-bit interface, thereby requiring data to be read or written in blocks of 64 bits (or 8 bytes). This is not a limitation if the processor always accesses data in large, sequential blocks. However, for workloads that transfer data in small, random chunks (e.g., searching a large array of 2-byte integers from a hash map, or using only a single 8-bit byte of data at random), memory accesses can become very inefficient.

In summary, in a typical commodity memory system, multiple DRAM devices (e.g., multiple individual DRAM chips) are arranged in parallel to provide a fixed-width data interface to a memory controller. Devices within a rank are accessed in lockstep, using the same address provided on a shared bus; this shared-bus organization is necessary because limited pin and routing resources in a memory module prevent individual addressing of each memory chip. As a result, the memory controller must always read and write data in blocks of a prescribed data word, regardless of the actual number of bytes requested by the processor.

Some embodiments of the present invention facilitate shorter connections between a memory controller and DRAM devices. These shorter connections enable individually addressable memory devices that collectively form a configurable-width memory channel that can adapt to different data-access patterns. Such architectures result in more efficient memory accesses, and allow data to be stored and organized in a more flexible manner.

Stacked Memory Systems

Some embodiments of the present invention comprise memory packages that increase memory chip density, shorten input/output (I/O) trace lengths, improve memory bandwidth, and reduce power use. For instance, some embodiments may stack memory and logic chips together vertically, connected using through-silicon vias (TSVs). Alternative embodiments may stack memory chips at an offset, thereby directly exposing the pins of each memory chip. The disclosed techniques allow the pins of stacked memory chips to be accessed over a much smaller footprint, thereby allowing the memory stack to placed directly on top of a logic chip or substrate (or, through the use of an intermediate layer, or "interposer," in close proximity to the logic chip or substrate).

Figure 3A:
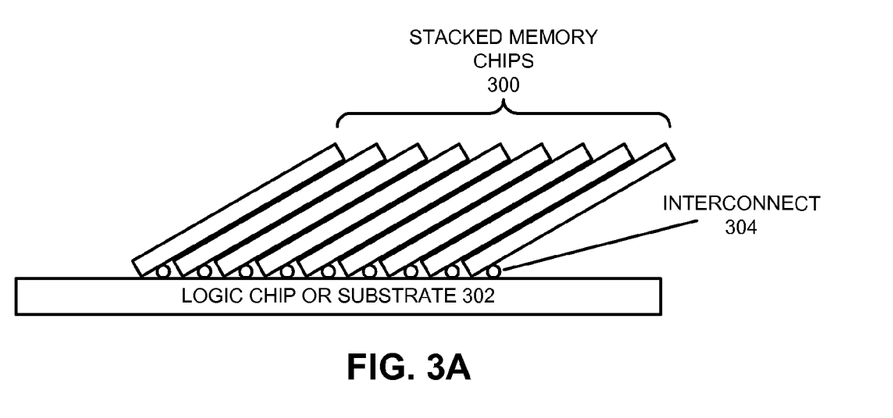
FIG. 3A illustrates a set of stacked memory chips that are stacked at an offset such that the pins of each memory chip are directly exposed to an underlying logic chip or substrate in accordance with an embodiment.

FIG. 3A illustrates a set of stacked memory chips 300 that are stacked at an offset such that the pins of each memory chip are directly exposed to an underlying logic chip or substrate 302. More specifically, the offset stacking of memory chips 300 allows each memory chip to be directly connected to the underlying logic chip or substrate 302 using an interconnect 304 (which may comprise a range of interconnect types including solder bumps, etc.). Note that the pitch of chips in the memory stack needs to match the pitch of bumps on the logic chip or substrate 302 (or the interposer 306 described below) to maintain a direct connection.

Figure 3B:
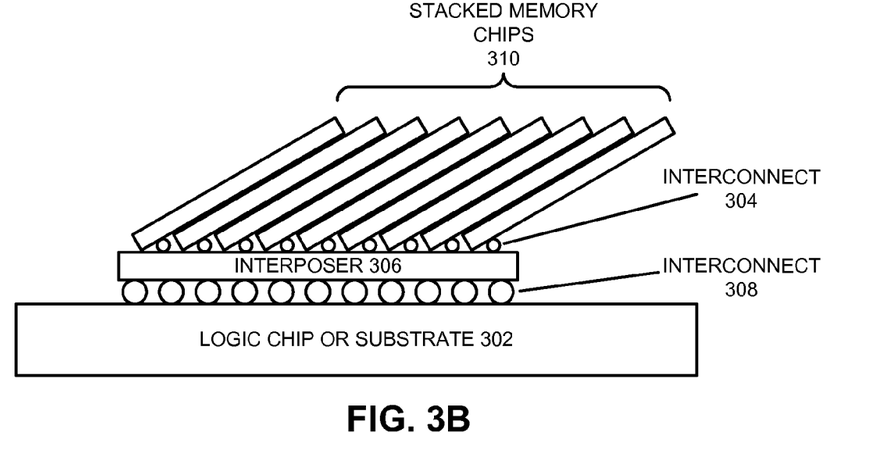
FIG. 3B illustrates a set of stacked memory chips that are stacked upon an interposer in accordance with an embodiment.

FIG. 3B illustrates an alternative architecture in which a set of stacked memory chips 310 are stacked upon an interposer 306 instead of directly onto underlying logic chip or substrate 302. As in FIG. 3A, memory chips 310 are stacked at an offset; however, in FIG. 3B the pins of each memory chip are instead directly connected to interposer 306 using interconnect 304. Interposer 306 is connected to the underlying logic chip or substrate 302 using another interconnect 308 (e.g., a ball-grid array). Note that interposer 306 may comprise different types of material (e.g., silicon, organic, and/or ceramic materials) and support different styles of connections. Silicon interposers, for instance, may include straight-through TSV connections. Note also that the interposer 306: may be designed to not interfere with cooling structures for the underlying logic chip or substrate 302; may in some instances be larger than an underlying logic chip; and/or may route power to the stacked memory chips.

In some embodiments, directly stacking memory chips over a processor chip provides substantial advantages over using separate memory packages (e.g., DIMMs). DIMM modules are typically arranged over a large printed circuit board, and include limited routing tracks, memory module connectors with limited pin counts, and traces that require termination. In contrast, the smaller footprint of a set of stacked memory chips allows the I/O pads on the memory chips to be mated directly to bumps on the processor such that I/O connections are short, direct, and require no routing. The number of memory chips that can be connected in this manner is typically limited only by the number of pins that can be put on the surface of the processor that faces the stacked memory chips (and/or faces the interposer). The resulting short I/O connections require no termination; hence, there is no static power penalty for having many parallel channels (as there would be for DIMM packages). Furthermore, because the memory chips are physically identical and uniformly distant from the processor, this architecture involves low latency and minimizes skew between different memory chips. Together, these properties facilitate using separate address and command channels to individually access each memory chip in the stack.

In some embodiments, stacking memory chips in close proximity to a logic chip facilitates providing a dedicated address and command bus for each memory chip, which further facilitates decoupling the traditionally competing challenges of maximizing data bandwidth and achieving fine-grain data access. The ability to address each chip separately enables configuring the width of the memory channel to optimize both heavily sequential and heavily random memory activities. For example, the stacked memory interface can present a wide data bus for sequential accesses by sending the same addresses and commands to all chips. Alternatively, the stacked memory interface can also present a narrow data bus in which only one chip is addressed at a time, thereby enabling random accesses for smaller data granularities.

Figure 4:
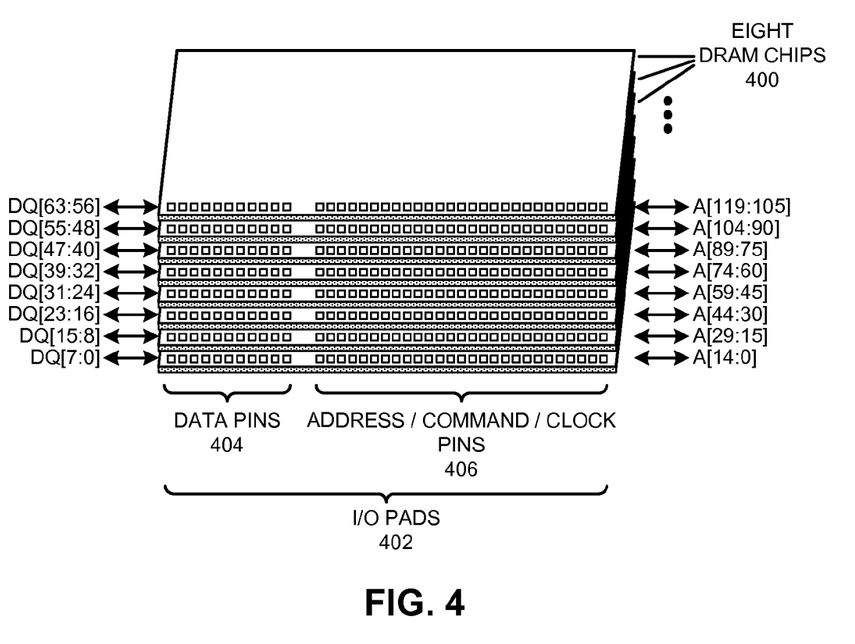
FIG. 4 illustrates an exemplary conceptual memory stack that is assembled using DRAM memory components in accordance with an embodiment.

FIG. 4 illustrates an exemplary conceptual memory stack that is assembled using DRAM memory components. Eight ×8 DRAM chips 400 form one rank that provides a 64-bit data bus. Each DRAM chip 400 includes a set of I/O pads 402 which are divided into a set of individually accessible data pins 404 and a set of individually accessible address, command, and clock pins 406 that include an individually accessible 15-bit address bus; note that the illustrated pin distributions are not representative of an actual layout, and that some additional pins and buses are not shown. Note also that the contacts on each individual memory chip are each directly connected to a distinct set of contacts on a host (e.g., a semiconductor die or interposer) such that the host has separate, unique command and address buses to individually address and communicate with each individual memory chip. During high-throughput sequential access, a requesting logic device may stripe data across all eight DRAM chips 400 by providing the same address to all chips (in a mode of operation that is similar to that of a standard DIMM), i.e.:

address=A[14:0]=A[29:15]=A[44:30]=A[59:45]=A[74:60]=A[89:75]=A[104:90]=A[119:105].

Alternatively, for efficient, finer-granularity random access the requesting logic device may instead address only a subset of chips at a time, such that the channel width more closely matches the size of the data being requested. For instance, to randomly access an array of two-byte integers, a processor might address only two DRAM chips directly, e.g.:

address=A[14:0]=A[29:15], while leaving the address lines of the other DRAM chips (A[119:30]) unasserted (e.g., as "don't care" values) and setting the memory command lines such that the other DRAM chips stay in a lower-power standby mode. The two active DRAM chips return the requested data via the DQ[15:0] data lines. Note that this is different from an access in a DIMM, where all of the memory chips would be activated and accessed (invoking an associated energy cost) to perform a full 64-bit word lookup even if only 16 bits were needed. In a stacked memory architecture, un-accessed DRAM chips may still consume power (e.g., operating in the standby mode), but do not consume the additional energy that would typically be required for an active access. In an alternative scenario, instead of accessing only a subset of memory chips in the stack, a memory controller may also access all chips concurrently, but with a different address for different subsets of the memory chips. For instance, for the above example, the memory controller of a processor chip may simultaneously send requests for different memory addresses to some or all of address pins A[119:30] in conjunction with accessing a first address from A[29:0].

Note that while FIG. 4 illustrates an exemplary memory stack with eight DRAM chips (for ease of comparison with a 64-bit DIMM), the described techniques can be applied to a stack with an arbitrary number of DRAM chips to provide even higher capacity and data throughput. However, if the footprint of the memory stack exceeds the size of the host logic chip and/or interposer, the number of usable channels may become limited by the host device.

Figure 5:
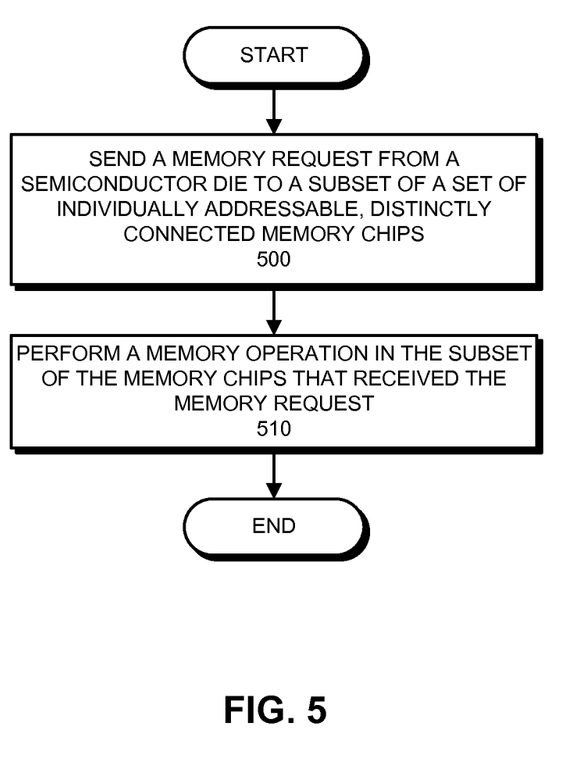
FIG. 5 presents a flow chart that illustrates the process of performing a configurable-width memory access in accordance with an embodiment.

FIG. 5 presents a flow chart that illustrates the process of performing a configurable-width memory access for a chip package that comprises a semiconductor die and two or more memory chips that are electrically connected to the semiconductor die. More specifically, contacts on each individual memory chip are each directly connected to a distinct set of contacts on the semiconductor die such that the semiconductor die has separate, unique command and address buses to individually address and communicate with each individual memory chip. During operation, the semiconductor die sends a memory request to a subset of the memory chips (operation 500), which then perform a memory operation in response to the memory request (operation 510). A second, distinct subset of the memory chips that do not store data requested in the memory request do not receive the memory request from the semiconductor die, and remain in a standby state. Performing the memory operation in only the first subset of memory chips reduces the power used by the chip package for memory requests with a data-access granularity that is smaller than the full memory width supported by the full set of memory chips.

In some embodiments, a customized memory controller facilitates accessing data with variable granularities from a stack of memory chips. For instance, for a given memory access, this customized memory controller may determine from a memory request the subset of DRAM chips that contain the needed data, and initiate appropriate requests to those DRAM chips. Furthermore, the customized memory controller may be configured to determine, upon receiving multiple memory requests (of potentially different granularities), that the received memory requests access different DRAM chips, and can be issued in parallel to different subsets of DRAM chips in the stack. For example, for a memory stack with 40-100 stacked DRAM chips (which might support 1000+ bits of memory bandwidth), a customized memory controller might be configured to access multiple words of data (at different addresses) from different subsets of memory chips while simultaneously, efficiently accessing individual bytes of data from other memory chips. Such techniques are not implementable in traditional DIMM architectures due to the overhead of routing such wide buses to and into a large quantity of DRAMs. Note that the benefits of being able to individually access a small set of memory chips (and not consume power in the un-accessed memory chips not storing the desired data) grow as the width of the memory channel increases.

In some embodiments, the described techniques may also involve striping data across stacked memory chips in a manner that facilitates efficient subsequent memory accesses. For instance, in some scenarios compilers and/or data-intensive applications (e.g., database applications) may be extended to be aware of (and able to take advantage of the capabilities of) the presence of a stacked memory chip architecture (and the capability of variable-width and/or parallel memory accesses). For example, consider the storage needs of a database application. Database files are typically stored (on disk or in memory) in either a row-major or a column-major format. Traditional database implementations often use a row-major format, where all the data of each row is grouped together, column after column. However, some alternative implementations adopt the column-major format, in which all the data of one column is stored contiguously, row after row, in a specified order. Storing data in a column-major format may provide performance benefits when projecting a column from many rows, and may also potentially enable higher data compression. A memory system with a configurable access width offers more flexibility in the way that data is organized and stored, and prevents unnecessary power wastage when randomly accessing fields that are narrower than the full width of the memory system.

Figure 6:
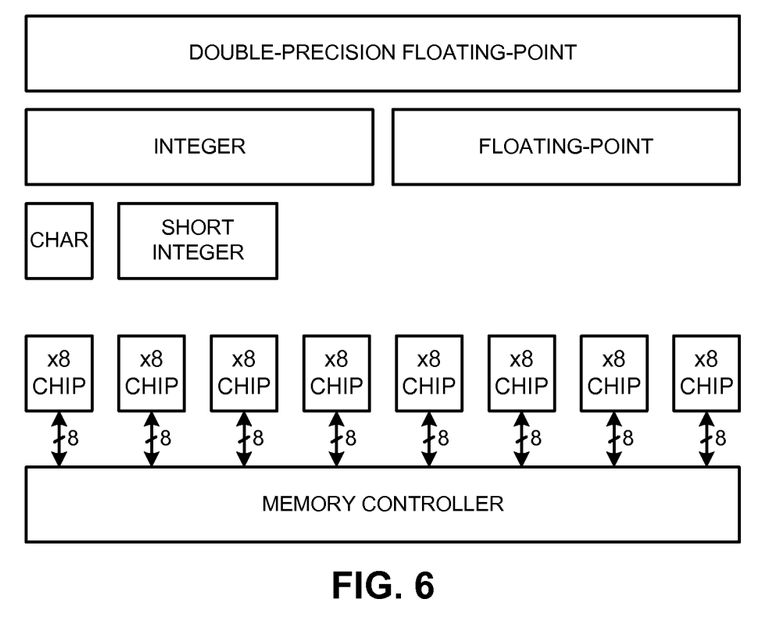
FIG. 6 illustrates an exemplary organization in which data is striped across a stacked memory system with eight ×8 DRAM memory chips in accordance with an embodiment.

FIG. 6 illustrates an exemplary organization in which data is striped across a stacked memory system with eight ×8 DRAM memory chips. In FIG. 6: 1-byte character fields are stored using one memory chip; 2-byte short integer fields are striped over two different memory chips; 4-byte integer and 4-byte floating-point fields are striped over two distinct groups of four memory chips; and 8-byte double-precision floating point values are stored using all eight memory chips. Such an arrangement can result in substantial power savings for workloads that frequently access fields that span only a subset of the memory chips.

Figure 7:
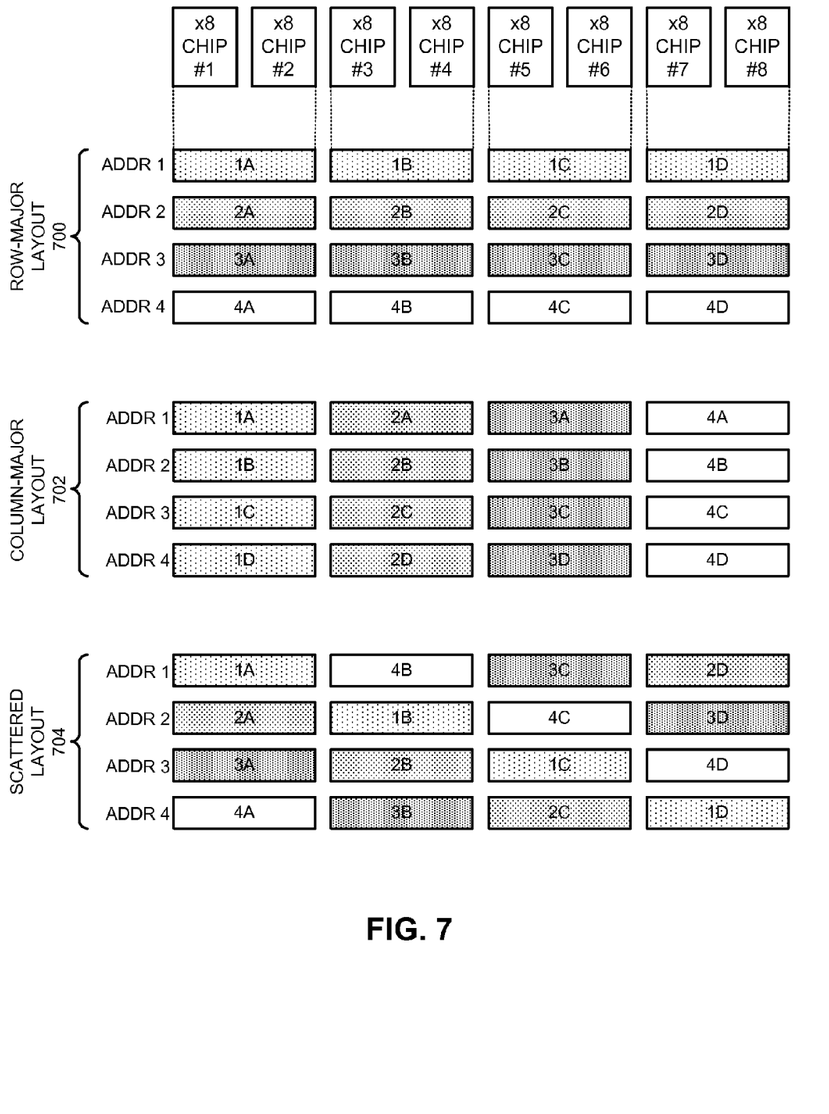
FIG. 7 illustrates several examples of memory layouts for a stacked memory system that are advantageous to specific workloads and applications in accordance with an embodiment.

As described above, stacked memory architectures not only allow a memory system to selectively access different chips to achieve variable-width data granularity, but also enable unique concurrent access to each memory device to achieve non-lineal memory addressing. FIG. 7 illustrates several examples of memory layouts for a stacked memory system that are advantageous to specific workloads and applications. More specifically, FIG. 7 illustrates a database application which stores a table consisting of 4 tuples (tuples 1-4) and 4 fields (fields A-D), where each field is two bytes wide and fits across two ×8 DRAM memory chips.

One section of FIG. 7 illustrates a row-major layout 700 in which each tuple is stored contiguously striped across the eight chips of the stacked memory. Row-major layout 700 facilitates accessing entire tuples; e.g., reading tuple 2 involves accessing address 2 of all eight chips. Another section of FIG. 7 illustrates a column-major layout 702 in which each column is stored contiguously striped across the eight chips of the stacked memory. Column-major layout 702 facilitates accessing entire columns of data; e.g., reading column C involves accessing address 3 of all eight chips. Note, however, that the opposite types of accesses can also be performed efficiently for these layouts in the context of individually addressable memory chips. For instance, a given column in row-major layout 700 can be accessed by successively accessing the appropriate pair of memory chips (and a given row in column-major layout 702 can be accessed by successively accessing the appropriate pair of memory chips); e.g., reading column B involves successively accessing addresses 1-4 from (only) memory chips [3:4]. These individual chip accesses consume less power than a comparable operation for a DIMM (which would involve accessing all of the chips even if only two of the chips' outputs were needed).

A third section of FIG. 7 illustrates a scattered layout 704 which, in the context of individually addressable memory chips, facilitates efficient access to data in both row and column formats. In scattered layout 704 the data is laid out in row-major format, but the address of each field is offset by one (note that a transposed arrangement would be equally effective). In this arrangement, reading tuples contiguously involves addressing all of the memory chips, with an offset in the access address between each pair of chips; e.g., reading tuple 2 involves accessing addresses {2,3,4,1} from chips {[1:2],[3:4],[5:6],[7:8]}, respectively. Reading columns involves successively accessing one pair of chips; e.g., reading column C involves successively accessing addresses {3,4, 1,2} from only chips [5:6]. Note that being able to individually access memory chips allows the memory system to efficiently support the two access patterns that are most common in database systems; these capabilities depend upon individually accessible memory chips, and are not possible for systems that use conventional DIMMs.

Note that variable-width memory access may complicate the implementation of error detection and correction using ECCs. In some embodiments, ECC for stacked memory architectures may involve additional memory-chip redundancy and additional memory controller support.

In summary, embodiments of the present invention comprise stacked memory architectures that increase memory chip density, shorten input/output (I/O) trace lengths, and improve memory bandwidth. These stacked memory architectures enable individually addressable memory devices that collectively form a memory channel with a configurable bus width that can adapt to different data-access patterns. Such architectures result in more efficient memory accesses, and allow data to be stored and organized in a more flexible manner.

Computing Environment

Figure 8:
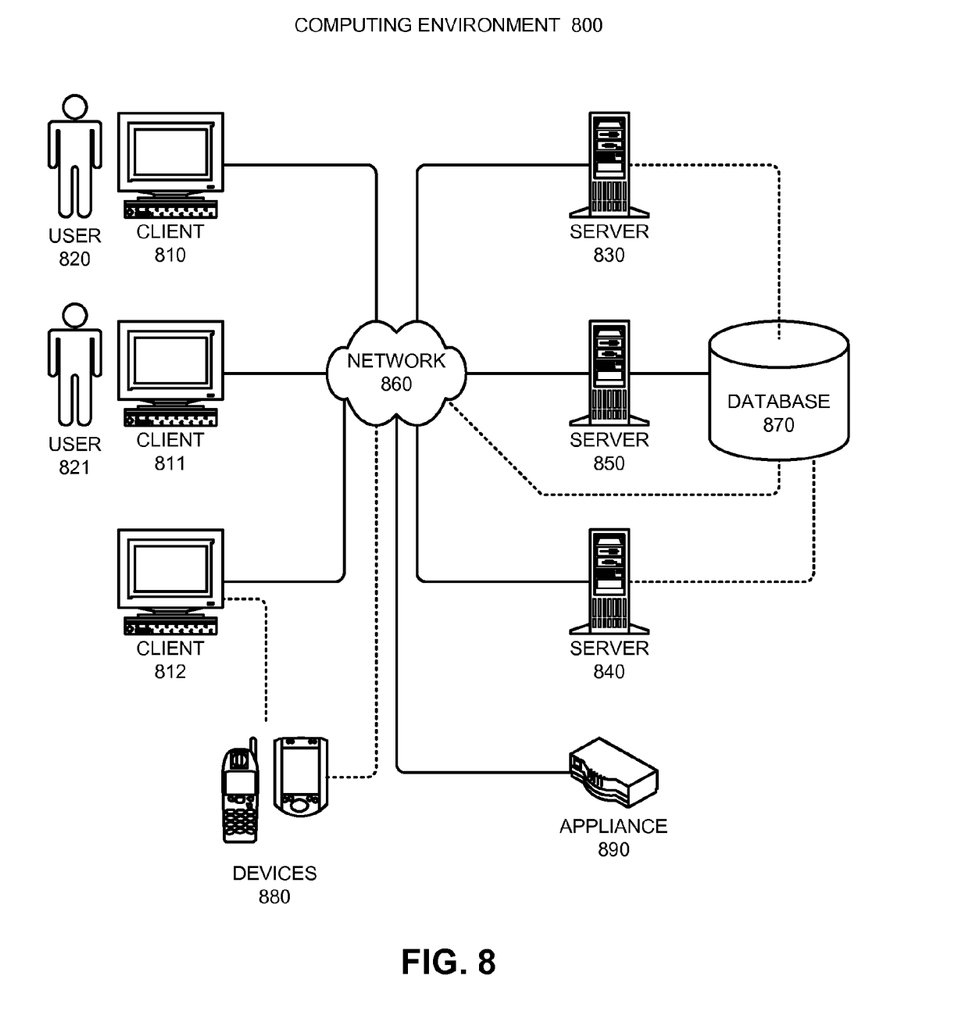
FIG. 8 illustrates a computing environment in accordance with an embodiment.

In some embodiments of the present invention, stacked memory structures can be incorporated into a wide range of computing devices in a computing environment. For example, FIG. 8 illustrates a computing environment 800 in accordance with an embodiment of the present invention. Computing environment 800 includes a number of computer systems, which can generally include any type of computer system based on a microprocessor, a mainframe computer, a digital signal processor, a portable computing device, a personal organizer, a device controller, or a computational engine within an appliance. More specifically, referring to FIG. 8, computing environment 800 includes clients 810-812, users 820 and 821, servers 830-850, network 860, database 870, devices 880, and appliance 890.

Clients 810-812 can include any node on a network that includes computational capability and includes a mechanism for communicating across the network. Additionally, clients 810-812 may comprise a tier in an n-tier application architecture, wherein clients 810-812 perform as servers (servicing requests from lower tiers or users), and wherein clients 810-812 perform as clients (forwarding the requests to a higher tier).

Similarly, servers 830-850 can generally include any node on a network including a mechanism for servicing requests from a client for computational and/or data storage resources. Servers 830-850 can participate in an advanced computing cluster, or can act as stand-alone servers. For instance, computing environment 800 can include a large number of compute nodes that are organized into a computing cluster and/or server farm. In one embodiment of the present invention, server 840 is an online "hot spare" of server 850. In other embodiments, servers 830-850 include coherent shared-memory multiprocessors.

Users 820 and 821 can include: an individual; a group of individuals; an organization; a group of organizations; a computing system; a group of computing systems; or any other entity that can interact with computing environment 800.

Network 860 can include any type of wired or wireless communication channel capable of coupling together computing nodes. This includes, but is not limited to, a local area network, a wide area network, or a combination of networks.

In one embodiment of the present invention, network 860 includes the Internet. In some embodiments of the present invention, network 860 includes phone and cellular phone networks.

Database 870 can include any type of system for storing data in non-volatile storage. This includes, but is not limited to, systems based upon magnetic, optical, or magneto-optical storage devices, as well as storage devices based on flash memory and/or battery-backed up memory. Note that database 870 can be coupled: to a server (such as server 850), to a client, or directly to a network.

Devices 880 can include any type of electronic device that can be coupled to a client, such as client 812. This includes, but is not limited to, cell phones, personal digital assistants (PDAs), smartphones, personal music players (such as MP3 players), gaming systems, digital cameras, portable storage media, or any other device that can be coupled to the client. Note that, in some embodiments of the present invention, devices 880 can be coupled directly to network 860 and can function in the same manner as clients 810-812.

Appliance 890 can include any type of appliance that can be coupled to network 860. This includes, but is not limited to, routers, switches, load balancers, network accelerators, and specialty processors. Appliance 890 may act as a gateway, a proxy, or a translator between server 840 and network 860.

Note that different embodiments of the present invention may use different system configurations, and are not limited to the system configuration illustrated in computing environment 800. In general, any device that includes a host chip or substrate and one or more memory chips may incorporate elements of the present invention.

In some embodiments of the present invention, some or all aspects of host surfaces and/or stacked chip structures can be implemented as dedicated hardware modules in a computing device. These hardware modules can include, but are not limited to, processor chips, application-specific integrated circuit (ASIC) chips, field-programmable gate arrays (FPGAs), memory chips, and other programmable-logic devices now known or later developed.

Note that a processor can include one or more specialized circuits or structures that support stacked memory structures. Alternatively, operations that access stacked memory chips may be performed using general-purpose circuits that are configured using processor instructions. Also, while FIGS. 3A-3B illustrate accessing stacked memory chips from a logic chip, substrate, and/or interposer, in alternative embodiments stacked chips may be accessed using alternative surfaces and/or interfaces.

In these embodiments, when the external hardware modules are activated, the hardware modules perform the methods and processes included within the hardware modules. For example, in some embodiments of the present invention, the hardware module includes one or more dedicated circuits for performing the operations described above. As another example, in some embodiments of the present invention, the hardware module is a general-purpose computational circuit (e.g., a microprocessor or an ASIC), and when the hardware module is activated, the hardware module executes program code (e.g., BIOS, firmware, etc.) that configures the general-purpose circuits to perform the operations described above.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A chip package that facilitates configurable-width memory channels, comprising:
a semiconductor die; and
two or more memory chips electrically connected to the semiconductor die;
wherein contacts on each individual memory chip are each directly connected to a distinct set of contacts on the semiconductor die such that the semiconductor die has separate, unique command and address buses to individually address and communicate with each individual memory chip.

2. The chip package of claim 1, wherein individually addressable memory chips that are each accessed via separate command and address buses facilitate a configurable-width memory channel that efficiently supports different data-access granularities.

3. The chip package of claim 2,
wherein during a first memory access the semiconductor die is configured to send a first memory request to a first subset of the two or more memory chips;
wherein the memory chips of the first subset are configured to perform a first memory operation in parallel in response to the first memory request;
wherein a second subset of the two or more memory chips not storing data requested by the first memory request do not receive the first memory request and remain in a standby state; and
wherein performing the first memory operation in only the first subset reduces the power used by the chip package for memory requests with a data-access granularity that is smaller than the full memory width supported by the two or more memory chips.

4. The chip package of claim 3,
wherein during a second memory access the semiconductor die is configured to send a second memory request to all of the two or more memory chips; and
wherein all of the memory chips are configured to perform a second memory operation in parallel in response to the second memory request, thereby using the full memory width supported by the two or more memory chips.

5. The chip package of claim 3,
wherein during a third memory access the first semiconductor is configured to send a third memory request to a third subset of the two or more memory chips and a fourth memory request to a fourth subset of the two or more memory chips, wherein the third subset is distinct from the fourth subset and the third memory request is distinct from the fourth memory request;
wherein the memory chips of the third subset are configured to perform a third memory operation in parallel in response to the third memory request;
wherein the memory chips of the fourth subset are configured to perform a fourth memory operation in parallel in response to the fourth memory request; and
wherein the third memory operation and the fourth memory operation are performed simultaneously.

6. The chip package of claim 5,
wherein the two or more memory chips are stacked upon the semiconductor die at an offset such that the pins of each memory chip are directly connected to contacts on the semiconductor die; and
wherein stacking the two or more memory chips upon the semiconductor die increases memory chip density and shortens I/O trace lengths, thereby facilitating individually addressing each of the two or more memory chips.

7. The chip package of claim 5,
wherein the two or more memory chips are stacked vertically on top of the semiconductor die; and
wherein the two or more memory chips are connected to the semiconductor die using through-silicon vias.

8. The chip package of claim 5,
wherein the chip package further comprises a customized memory controller that facilitates accessing data with variable granularities from the two or more memory chips;
wherein the customized memory controller is configured to determine whether only a subset of the two or more memory chips are needed for a given memory access and, if so, issue requests to only the subset of the two or more memory chips; and
wherein the customized memory controller is further configured to determine whether multiple memory requests access different subsets of the two or more memory chips and, if so, issue parallel requests to the different subsets of the two or more memory chips.

9. The chip package of claim 8, wherein a compiler is configured to generate memory instructions that store data into the two or more memory chips in a layout that takes advantage of the configurable-width memory channel to reduce the power usage of the chip package during operation.

10. The chip package of claim 8, wherein an application is configured to perform memory operations that store data into the two or more memory chips in a layout that takes advantage of the configurable-width memory channel to reduce the power usage of the chip package during operation.

11. A chip package that facilitates configurable-width memory channels, comprising:
a semiconductor die;
an interposer electrically connected to the semiconductor die, wherein contacts on the interposer are directly connected to contacts on the semiconductor die; and
two or more memory chips electrically connected to the interposer;
wherein contacts on each individual memory chip are each directly connected to a distinct set of contacts on the interposer such that the semiconductor die has separate, unique command and address buses to individually address and communicate with each individual memory chip via the interposer.

12. The chip package of claim 11, wherein the interposer is larger than the semiconductor die.

13. The chip package of claim 11, wherein the interposer provides power to the two or more memory chips.

14. The chip package of claim 11, wherein individually addressable memory chips that are each accessed via separate command and address buses facilitate a configurable-width memory channel that efficiently supports different data-access granularities.

15. The chip package of claim 14,
wherein during a first memory access the semiconductor die is configured to send a first memory request to a first subset of the two or more memory chips;
wherein the memory chips of the first subset are configured to perform a first memory operation in parallel in response to the first memory request;
wherein a second subset of the two or more memory chips not storing data requested by the first memory request do not receive the first memory request and remain in a standby state; and wherein performing the first memory operation in only the first subset reduces the power used by the chip package for memory requests with a data-access granularity that is smaller than the full memory width supported by the two or more memory chips.

16. The chip package of claim 15,
wherein during a second memory access the first semiconductor is configured to send a third memory request to a second subset of the two or more memory chips and a third memory request to a third subset of the two or more memory chips, wherein the second subset is distinct from the third subset and the second memory request is distinct from the third memory request;
wherein the memory chips of the second subset are configured to perform a second memory operation in parallel in response to the second memory request;
wherein the memory chips of the third subset are configured to perform a third memory operation in parallel in response to the third memory request; and
wherein the second memory operation and the third memory operation are performed simultaneously.

17. The chip package of claim 16,
wherein the two or more memory chips are stacked upon the semiconductor die at an offset such that the pins of each memory chip are directly connected to contacts on the semiconductor die; and
wherein stacking the two or more memory chips upon the semiconductor die increases memory chip density and shortens I/O trace lengths, thereby facilitating individually addressing each of the two or more memory chips.

18. The chip package of claim 17,
wherein the chip package further comprises a customized memory controller that facilitates accessing data with variable granularities from the two or more memory chips;
wherein the customized memory controller is configured to determine whether only a subset of the two or more memory chips are needed for a given memory access and, if so, issue requests to only the subset of the two or more memory chips; and wherein the customized memory controller is further configured to determine whether multiple memory requests access different subsets of the two or more memory chips and, if so, issue parallel requests to the different subsets of the two or more memory chips.

19. The chip package of claim 18,
wherein a compiler is configured to generate memory instructions that store data into the two or more memory chips in a layout that takes advantage of the configurable-width memory channel to reduce the power usage of the chip package during operation; and
wherein an application is configured to perform memory operations that store data into the two or more memory chips in the layout.

20. A method for performing a configurable-width memory access, the method comprising:
sending a memory request to a first subset of two or more memory chips, wherein the two or more memory chips and a semiconductor die comprise a chip package in which the two or more memory chips are electrically connected to the semiconductor die, wherein contacts on each individual memory chip are each directly connected to a distinct set of contacts on the semiconductor die such that the semiconductor die has separate, unique command and address buses to individually address and communicate with each individual memory chip; and
performing a memory operation in the memory chips of the first subset in response to the memory request;
wherein a second subset of the two or more memory chips not storing data requested in the first memory request do not receive the first memory request and remain in a standby state; and
wherein performing the memory operation in only the first subset reduces the power used by the chip package for memory requests with a data-access granularity that is smaller than the full memory width supported by the two or more memory chips.

* * * * *